United States Patent [19]
Soderstrand

[11] 3,955,150
[45] May 4, 1976

[54] ACTIVE-R FILTER

[75] Inventor: Michael A. Soderstrand, San Francisco, Calif.

[73] Assignee: The United States of America as represented by the United States Energy Research & Development Administration, Washington, D.C.

[22] Filed: Jan. 15, 1975

[21] Appl. No.: 541,177

[52] U.S. Cl. .............................. 330/103; 328/167; 330/107; 330/109
[51] Int. Cl.² ........................................ H03F 1/36
[58] Field of Search ............ 328/167; 330/107, 109, 330/103

[56] References Cited
OTHER PUBLICATIONS

R. Brandt, "Active Resonators Save Steps in Designing Active Filters", Electronics, pp. 106–110, Apr. 24, 1972.

*Primary Examiner*—R. V. Rolinec
*Assistant Examiner*—Lawrence J. Dahl
*Attorney, Agent, or Firm*—Dean E. Carlson; Dudley W. King; Richard E. Constant

[57] ABSTRACT

An operational amplifier-type active filter in which the only capacitor in the circuit is the compensating capacitance of the operational amplifiers, the various feedback and coupling elements being essentially solely resistive.

6 Claims, 16 Drawing Figures

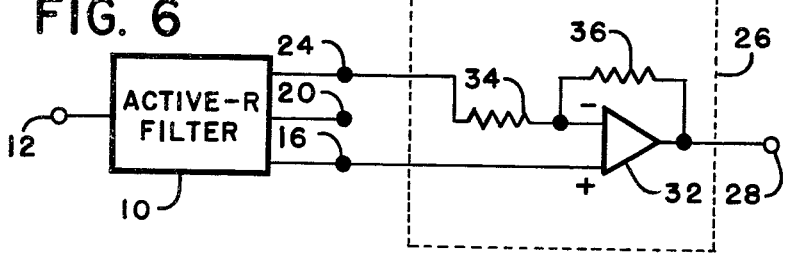
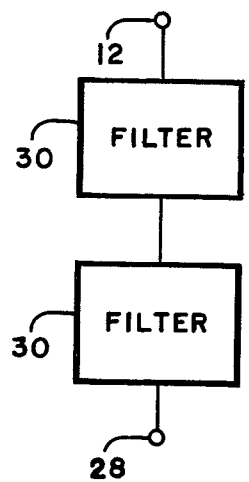
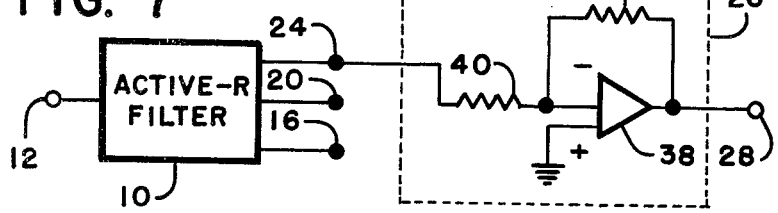
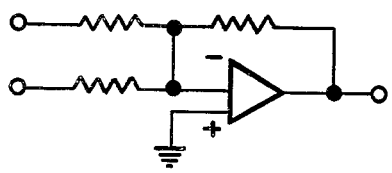
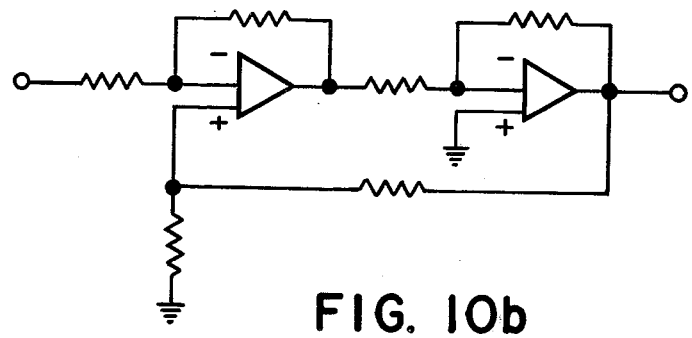
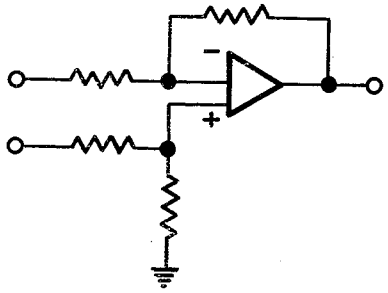
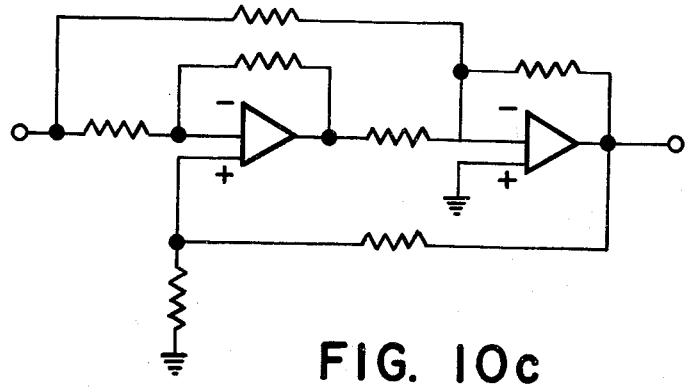
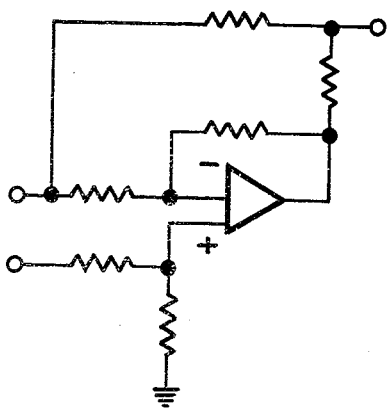
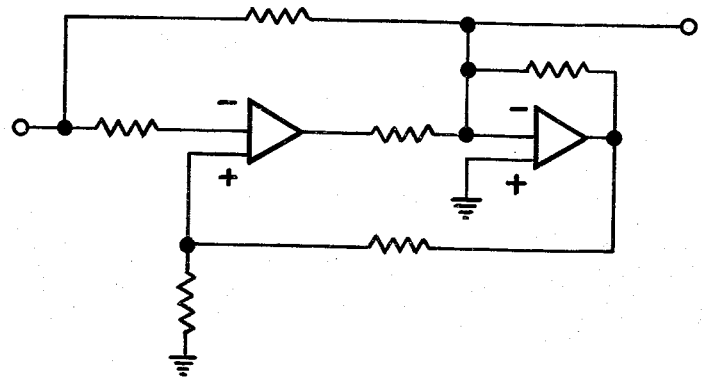

ACTIVE-R FILTER

BACKGROUND OF INVENTION

Active filters have been developed in which the active element utilized is an operational amplifier. These active filters are of very small size and weight compared to passive filter networks and other active filters and eliminate the need for inductors to provide the desired filter transfer functions.

These active filters, even though they have eliminated the need for inductors, still require the use of one or more high quality capacitor filter elements in the circuit having a capacitance generally above about 1,000 picofarads. As the need to make these active filter circuits of still smaller size for modern applications increases, such as in completely integrated circuit designs, the provision of suitable temperature, frequency, voltage, and time stable capacitors which are of small size is continually more difficult to achieve. High quality capacitors having superior stability characteristics are generally quite expensive and large in size whereas physically small capacitors, such as ceramic capacitors, exhibit relatively poor stability characteristics. When these smaller capacitors are used as a part of the filter capacitance, the filter circuit may be highly Q-sensitive to circuit element value changes and may exhibit unstable or severe amplitude peaking or attenuation.

Operational amplifiers, and particularly integrated circuit operational amplifiers, often have a relatively poor frequency response which can by proper design be controlled to an acceptable level. This control may be obtained either by a compensating capacitor, which can be of poor quality and small enough to be incorporated in an integrated circuit chip, or by careful design of the operational amplifier using the parasitic capacitances inherent in the circuit. Typical commercially available integrated circuit operational amplifiers which include compensating capacitors therein are such as the commonly referred to 741-type operational amplifiers. Other types of compensated operational amplifiers include the 536, 107, 5556, 740 and 747. Other operational amplifiers which require an external capacitor compensation may include the 709, 748, 101 and 531 types. These operational amplifier types are available from such manufacturers as the Burr-Brown Research Corporation, Fairchild Semiconductor, Motorola, Texas Instruments, and the like.

SUMMARY OF INVENTION

In view of the above, it is an object of this invention to provide active filters which utilize resistors solely as the passive coupling and feedback elements.

It is a further object of this invention to provide an active-R filter which may be utilized for low-pass, high-pass and band-pass filtering.

It is a still further object of this invention to provide an active filter which utilizes a relatively small number of components.

It is a still further object of this invention to provide an active filter which is readily adaptable to integrated circuit fabrication.

Various other objects and advantages will appear from the following description of the invention, and the most novel features will be particularly pointed out hereinafter in connection with the appended claims. It will be understood that various changes in the details, and arrangements of the parts, which are herein described and illustrated in order to explain the nature of the invention, may be made by those skilled in the art.

The invention relates to active-R filters which utilize operational amplifiers having feedback and coupling components which are solely resistive.

DESCRIPTION OF DRAWING

Various aspects of the present invention are illustrated in the accompanying drawing wherein:

FIG. 6 is a circuit diagram of the active-R filter of FIGS. 3 and 5 modified to provide a band-elimination response;

FIG. 7 is a combined block and schematic diagram of a further modified filter of FIG. 5 to provide a Bessel low-pass filter;

FIG. 8 is a block diagram illustrating the cascading of circuits illustrated in FIG. 5;

FIGS. 9a, 9b and 9c illustrate various first order filter summing circuits which may be utilized in the circuit of FIG. 5; and FIGS. 10a, 10b and 10c illustrate other forms of active-R filters which may result from the present invention.

DETAILED DESCRIPTION

It is been found that in order to provide active-R filters using operational amplifiers interconnected only with resistive elements, the operational amplifiers should have a high impedance differential input, a differential gain from an input to the output in excess of the decibel (dB) spread required in the filtering application, and the amplifier should have properties which will insure overall filter circuit stability with the resistor feedback levels required. It has further been found, that in order to guarantee proper operation and stability, the parasitic capacitances of the operational amplifier elements must appear from the outside of the amplifier to be concentrated in a single lumped capacitance, or that an internal compensation capacitor or an external compensation capacitor must be provided; the apparent capacitance of any of these may typically be from about 10 to 30 picofarads (but may also be in the range of from about 1 to 1000 picofarads). This apparent capacitance, regardless of form, may be of relatively low tolerance without degradation of the filter performance and may thus be readily incorporated into integrated-type circuit designs. Commercially available operational amplifiers which require external compensation are provided with terminals to which the compensating capacitor may be connected.

Figure 1:
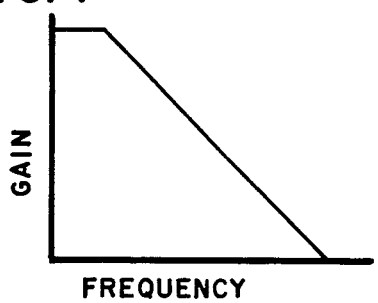
FIG. 1 illustrates a typical frequency response of an operational amplifier which may be utilized in the active-R filters of this invention.

An operationsl amplifier which is to be used in an active-R filter should exhibit a gain roll-off characteristic of about 6 db/octave with an input to output phase shift of about −90° (this may vary by as much as about ± 6 db/octave or ± 90° with a corresponding degradation of performance). This roll-off and phase shift is caused by the parasitic capacitance which, if the roll-off and phase shift is not of the proper type, may require the above referred to internal or external compensating capacitors to achieve the proper roll-off and phase shift. A typical frequency response curve or plot for an operational amplifier having the desired roll-off and stability is shown in FIG. 1. By way of example, the maximum gain of many operational amplifiers may be from about 80 to 100 dB with the roll-off beginning at about 10 to 50 Hz and terminating at from about 1 to 100 MHz.

Figure 2:
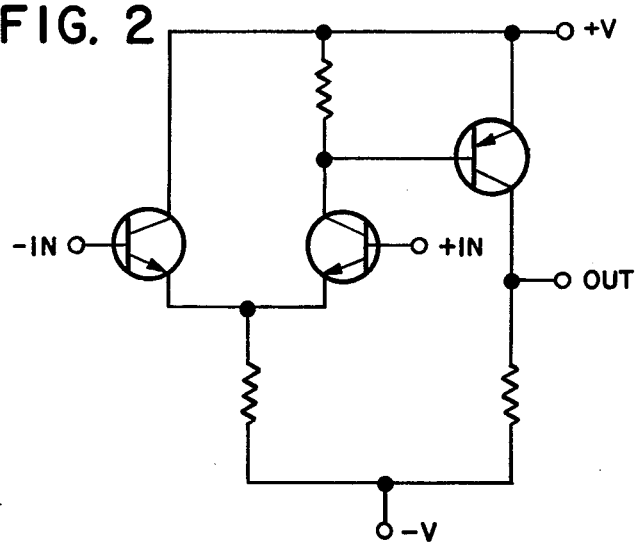
FIG. 2 is a simplified schematic diagram of an operational amplifier.

A highly simplified circuit diagram of an operational amplifier using parasitic capactiance compensation which may be used in this invention is shown in FIG. 2. Such a circuit should utilize transistors having betas of approximately 60 to insure achieving the desired stability properties. The circuit may include a differential input section formed by a matched pair of transistors and a single transistor, grounded emitter output stage. It is understood that a practical operational amplifier circuit would be significantly more complex than that shown primarily due to other features such as protection circuitry and various manufacturing considerations, particularly in integrated circuit applications. Using an integrator model of such operational amplifiers to approximate the frequency response characteristics thereof, the open-loop response or frequency-dependent gain of the operational amplifiers can be considered as either a positive or negative integrator with the amplifier cut-off frequency ($\omega_u$) (s is the complex frequency). It has been found, using this relationship, that the active-R filter circuit in FIG. 3 may be developed. The active-R filter 10 may include a coupling resistor $R_i$ (which may include the source resistance) connected between an input terminal 12 and the negative input of a first operational amplifier $A_1$. The output of the operational amplifier $A_1$, in turn, is connected to the positive input of a second operational amplifier $A_2$. The output of operational amplifier $A_2$ is coupled by a feedback resistor $R_2$ to the negative input of operational amplifier $A_1$. The output of operational amplifier $A_1$ is coupled by a second feedback resistor $R_3$ back to its negative input. The positive input of operational amplifier $A_1$ and the negative input of operational amplifier $A_2$ are connected to ground or common. The junction 14 of resistors $R_1$, $R_2$ and $R_3$ and the negative input of amplifier $A_1$ may be connected to an appropriate high-pass output terminal 16. The junction 18 of resistor $R_3$, the output of amplifier $A_1$ and the postive input of amplifier $A_2$ may be connected to an appropriate band-pass terminal 20. The junction 22 of resistor $R_2$ and the output of amplifier $A_2$ may be connected to an appropriate low-pass output terminal 24.

With a suitable signal source connected to input 12 of filter 10, a signal may be coupled through resistor $R_1$ and junction 14 to the respective circuit elements and amplifiers. Since each amplifier amplifies low frequencies much more than high frequencies, as shown in FIG. 1, the low-pass output terminal 24 will include all signal frequencies up to a certain frequency called the pole frequency ($\omega_n$). The high-pass output terminal 16 passes a combination of signals from the input coupled through resistor $R_1$, and the outputs of amplifier $A_1$ coupled through resistor $R_3$ and of amplifier $A_2$ coupled through resistor $R_2$. Since amplifier $A_1$ is an inverting amplifier, and amplifier $A_2$ is a non-inverting amplifier, both the signal from amplifier $A_1$ and signed from amplifier $A_2$ tend to cancel the input signal. At low frequencies the gains of the amplifiers are high and the cancellations are nearly complete, while at higher frequencies the gains of the amplifiers drop off and the higher frequencies in the input signal are essentially coupled without change to the high-pass output terminal 16, that is, those signal frequencies higher than the pole frequency. The signal at the band-pass output terminal 20 is simply the output of amplifier $A_1$ times the signal at the high-pass output terminal 16. At low frequencies this is nearly zero because the voltage of the high-pass output terminal is nearly zero. At high frequencies, the band-pass output is nearly zero because the amplifier $A_1$ loses gain at high frequencies. Thus, only signals with frequencies near the pole frequency exhibit a maximum signal output at terminal 20.

The resistor $R_2$ determines the pole frequency, the relationship being such that in order to double the pole frequency, resistor $R_2$ must be divided by 4. If resistor $R_2$ equals 1 ohm, the pole frequency is equal to the geometric mean of the gain-bandwidth-products of the two operational amplifiers $A_1$ and $A_2$. The resistor $R_3$ determines the bandwidth of the band-pass response and the degree of peaking in the low-pass and high-pass responses. To double the bandwidth, resistor $R_3$ must be divided by two. When $R_3$ is equal to 1 ohm, the bandwidth is equal to the gain-bandwidth product of amplifier $A_1$. Resistor $R_1$, in turn, must be chosen so that the normalized parallel combination of resistors $R_1$, $R_2$ and $R_3$ is 1 ohm. It is understood, that the value of each resistor may be multiplied by the same factor to denormalize the resistances to a more practical level, as desired. The transfer functions and design equations for the three output terminals, in which the cut-off frequencies of amplifiers $A_1$ and $A_2$ are represented by $\omega_{1u}$ and $\omega_{2u}$ respectively, the cut-off frequency of the desired filter is represented by $\omega_n$, and the bandwidth of the filter circuit is represented by $\omega n/Q$, are as follows:

High-Pass $$T_{HP}(s) = \frac{\frac{1}{R_1}s^2}{\left(\frac{1}{R_1} + \frac{1}{R_2} + \frac{1}{R_3}\right)s^2 + \left(\frac{\omega_{1u}}{R_3}\right)s + \frac{\omega_{1u}\omega_{2u}}{R_2}} \quad (13)$$

Band-Pass $$T_{BP}(s) = \frac{\frac{\omega_{1u}}{R_1}s}{\left(\frac{1}{R_1} + \frac{1}{R_2} + \frac{1}{R_3}\right)s^2 + \left(\frac{\omega_{1u}}{R_3}\right)s + \frac{\omega_{1u}\omega_{2u}}{R_2}} \quad (14)$$

Low-Pass $$T_{LP}(s) = \frac{-\frac{\omega_{1u}\omega_{2u}}{R_1}}{\left(\frac{1}{R_1}+\frac{1}{R_2}+\frac{1}{R_3}\right)s^2 + \left(\frac{\omega_{1u}}{R_3}\right)s + \frac{\omega_{1u}\omega_{2u}}{R_2}} \quad (15)$$

The design equations are $$R_1 = \frac{Q\omega_{1u}\omega_{2u}}{Q(\omega_{1u}\omega_{2u} - \omega_n^2) - \omega_{2u}\omega_n}$$

$$R_2 = \frac{\omega_{1u}\omega_{2u}}{\omega_n^2} \quad (16)$$

$$R_3 = \frac{Q\omega_{1u}}{\omega_n}$$

where $$\omega_n < (\omega_{1u}\omega_{2u})^{1/2}\left(1 + \frac{\omega_{2u}}{4Q^2\omega_{1u}}\right)^{1/2} - \frac{\omega_{2u}}{2Q} \approx (\omega_{1u}\omega_{2u})^{1/2}$$

Figure 3:
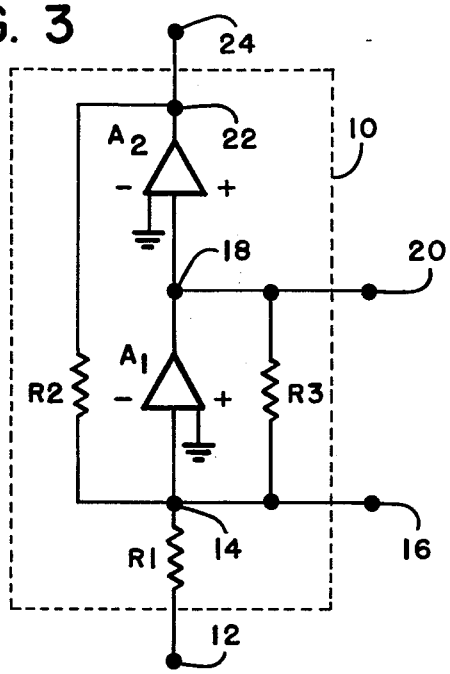
FIG. 3 is a schematic diagram of an active-R filter constructed in accordance with this invention which is capable of providing a low-pass, band-pass and high-pass filter output.
Figure 4A:
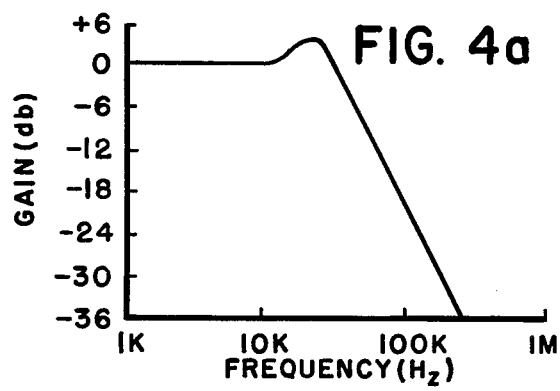
FIG. 4a, 4b and 4c illustrate typical low-pass, band-pass and high-pass response curves for the active-R filter shown in FIG. 3.
Figure 4B:
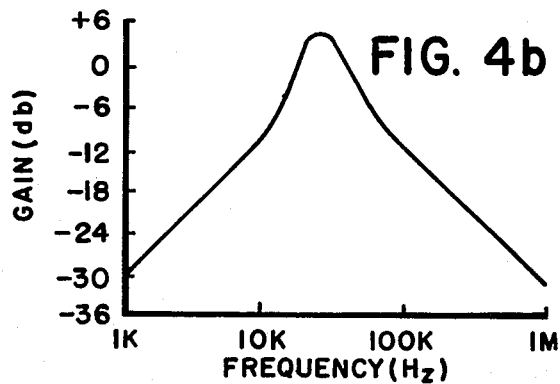
Figure 4C:
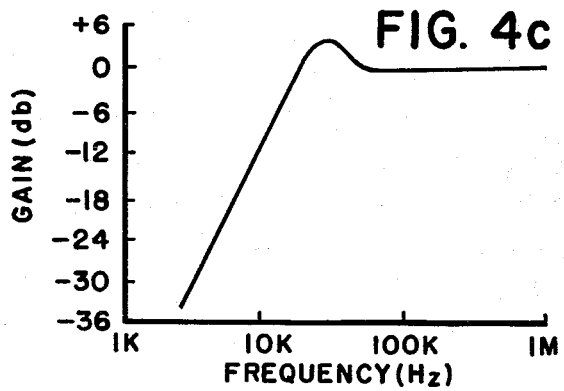

Using 741-type operational amplifiers having internal frequency compensation of 30 picofarads and resistance values for $R_1$, $R_2$ and $R_3$ of 50 ohms, 10 Kohms and 1.25 Kohms respectively, the filter of FIG. 3 exhibited a low-pass response as shown in FIG. 4a, a band-pass response as shown in FIG. 4b and a high-pass response as shown in FIG. 4c.

As noted above, the active-R filter 10 of FIG. 3 is a second order filter having high-pass, band-pass and low-pass output terminals 16, 20 and 24 respectively. If the output terminals 16, 20 and 24 are coupled to different inputs of a summing amplifier 26, as shown in FIG 5, and the respective gains at the summing amplifier 26 inputs are appropriately adjusted, the output 28 of the summing amplifier may be selected to provide any one of these filter characteristics as well as band-elimination, all-pass, etc., characteristics, the determination of the respective summing and amplifier 26 gains may also determine whether the overall filter building block 30, designated by the dotted lines, is a second or third order building block.

If the summing amplifier 26 includes an operational amplifier 32, as shown in FIG. 6, having its positive input coupled to the high-pass output terminal 16 of the active-R filter 10, its negative terminal coupled through a resistor 34 to the low-pass output terminal 24 of filter 10, a feedback resistor 36 coupled between the output of amplifier 32 and its negative input, the output of amplifier 32, at terminal 28, will exhibit a band elimination filtering characteristic with appropriate selection of resistor values and operational amplifier. For example, using a 741-type operational amplifier, resistor 34 may have a value of 10 Kohm while resistor 36 may have a value of 100 ohms. The overall filter shown in FIG. 6 will appear to be a second order filter.

If the summing amplifier 26 takes the form, as shown in FIG. 7, of an operational amplifier 38 having its negative input coupled through a resistor 40 to the low-pass output terminal 24 of active-R filter 10, a feedback resistor 42 connected between the negative input of amplifier 38 and its output and output terminal 28, and its positive input coupled to ground or common, the combined active-R filter and summing amplifier 26 will appear as a third order Bessel low-pass filter when appropriate components are selected. For example, using a 741-type operational amplifier 38, resistor 40 may have a value of 51 Kohm and resistor 42 may have a value of 6.6 Kohm. In addition, the resistors in active-R filter 10 should have values of 1.3 Kohm, 47 Kohm and 4.7 Kohm for resistors $R_1$, $R_2$ and $R_3$, respectively.

Figure 5:
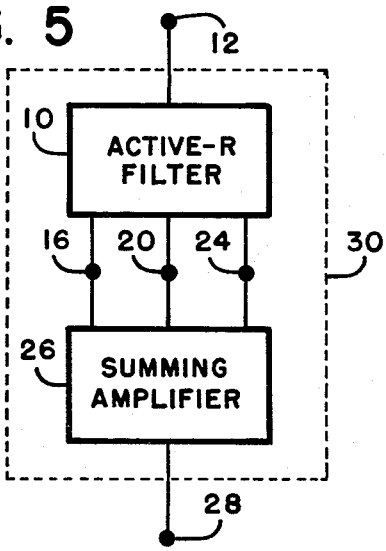
FIG. 5 is a simplified block diagram of the filter of FIG. 3 using a summing amplifier to determine the type and order of the filter.

The overall filters which include the combination of an active-R filter 10 and a summing amplifier 26, namely the filter 30 as shown in FIG. 5, may be cascaded as shown in FIG. 8, to provide any desired higher order filter. For example, each second or third order filter section 30 may be realized with the circuit of FIGS. 5, 6 or 7, or the like, and may then be cascaded as in FIG. 8 to obtain fourth order or higher order filters.

Using the integrator model for the operational amplifier characteristic shown in FIG. 1, active-RC filters may be changed to active-R filters by replacing passive-RC portions in the circuits with appropriate first order active-R filters which are variations of the summing amplifier 26 described above. For example, FIGS. 9a, 9b and 9c illustrate basic summing amplifier first order filter building blocks which may be utilized to replace passive-RC portions in second-order active-RC filters or as summing amplifier 26 additions to FIG. 5. Resulting second-order active-R filters are shown in FIGS. 10a, 10b and 10c which are low-pass, band-pass, and high-pass filters, respectively.

The active-R filters described above may better utilize the available gain-bandwidth-product of operational amplifiers than has been achieved with previous active-RC filters to result in improvement in the high frequency limit of the active-R filters. In addition, these active-R filters do not require the use of high precision and high value capacitors and may be more readily fabricated into completely integrated circuit configurations.

What is claimed is:

1. An active-R filter consisting essentially of first and second operational amplifiers, each amplifier including an inverting input, a noninverting input and an output; means for directly connecting an input resistor through a first junction to the inverting input of said first operational amplifier; means for directly connecting the output of said first operational amplifier through a second junction to the noninverting inpput of said second operational amplifier; means for directly connecting a first feedback resistor between the inverting input of said first operational amplifier through a third junction to the output of said second operational amplifier; means for directly connecting a second feedback resistor between the inverting input and the output of said first operational amplifier from said first junction to said second junction; and means for connecting the noninverting input of said first operational amplifier and the inverting input of said second operational amplifier to ground, said first junction of said input, first feedback and second feedback resistors and the inverting input of said first operational amplifier being a high-pass filter output, said second junction of said second feedback resistor and the output of said first operational amplifier and the noninverting input of said second operational amplifier being a band-pass filter output, and said third junction of said first feedback resistor and the output of said second operational amplifier being a low-pass filter output.

2. The filter of claim 1 wherein the normalized parallel resistance of said resistors is equal to about 1 ohm.

3. The filter of claim 1 wherein said operational amplifiers are integrated circuits having an apparent capacitance of from about 1 to 1000 picofarads.

4. The filter of claim 3 wherein said operational amplifiers have a roll-off of about 6 dB/octave and phase shift of about −90°.

5. The filter of claim 1 including a summing amplifier having an input coupled to said junctions.

6. The filter of claim 5 including an additional filter as recited in claim 1 having its input resistor coupled to the output of said summing amplifier.

* * * * *